(12) United States Patent
Sugiyama

(10) Patent No.: US 8,760,577 B2
(45) Date of Patent: Jun. 24, 2014

(54) CLOCK DATA RECOVERY CIRCUIT AND DISPLAY DEVICE

(75) Inventor: Akio Sugiyama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 240 days.

(21) Appl. No.: 12/819,776

(22) Filed: Jun. 21, 2010

(65) Prior Publication Data

US 2011/0025913 A1 Feb. 3, 2011

(30) Foreign Application Priority Data

Jul. 28, 2009 (JP) ................................. 2009-175228

(51) Int. Cl.
- *H03L 7/00* (2006.01)
- *H04L 7/00* (2006.01)
- *H03D 3/24* (2006.01)

(52) U.S. Cl.
USPC ............................ 348/537; 375/368; 375/376

(58) Field of Classification Search
USPC ............ 348/536–548; 375/373–376, 368, 365
See application file for complete search history.

(56) References Cited

U.S. PATENT DOCUMENTS

| 6,295,327 | B1 * | 9/2001 | Takla ............................. 375/375 |
| 7,038,488 | B1 * | 5/2006 | Tyson ............................. 326/37 |
| 7,366,269 | B2 | 4/2008 | Ishida et al. |
| 2005/0238129 | A1 * | 10/2005 | Ishida et al. .................. 375/376 |

FOREIGN PATENT DOCUMENTS

| JP | 4-132048 A | 5/1992 |
| JP | 10-126455 A | 5/1998 |
| JP | 2005-318014 (A) | 11/2005 |

OTHER PUBLICATIONS

Taiwanese Office Action of applicaiton No. 099121299, dated Aug. 1, 2013.*
Chinese Office Action of application No. 201010221371.4, dated Jul. 31, 2013.*
Office Action issued in corresponding Korean application No. 2010-0059915 and partial English translation; Oct. 24, 2012; 6 pages.

\* cited by examiner

*Primary Examiner* — Michael Lee
(74) *Attorney, Agent, or Firm* — Foley & Lardner LLP

(57) ABSTRACT

A clock data recovery circuit has: a receiver circuit configured to receive a serial data including a predetermined pattern and to sample the serial data in synchronization with a clock signal to generate a sampled data; a PLL circuit configured to perform clock data recovery based on the sampled data to generate the clock signal; and a false lock detection circuit configured to detect false lock of the PLL circuit by detecting a false lock pattern included in the sampled data. The false lock pattern is a pattern obtained by the receiver circuit sampling the predetermined pattern when the false lock of the PLL circuit occurs.

10 Claims, 12 Drawing Sheets

Fig. 6

PATTERN ① | "0" | "0" | "1" | "1" | "0" | · · · | "1" | "0" | "0" | "1" | "1" |

PATTERN ② | "0" | "1" | "1" | "0" | "0" | · · · | "0" | "0" | "1" | "1" | "0" |

PATTERN ③ | "1" | "1" | "0" | "0" | "1" | · · · | "0" | "1" | "1" | "0" | "0" |

PATTERN ④ | "1" | "0" | "0" | "1" | "1" | · · · | "1" | "1" | "0" | "0" | "1" |

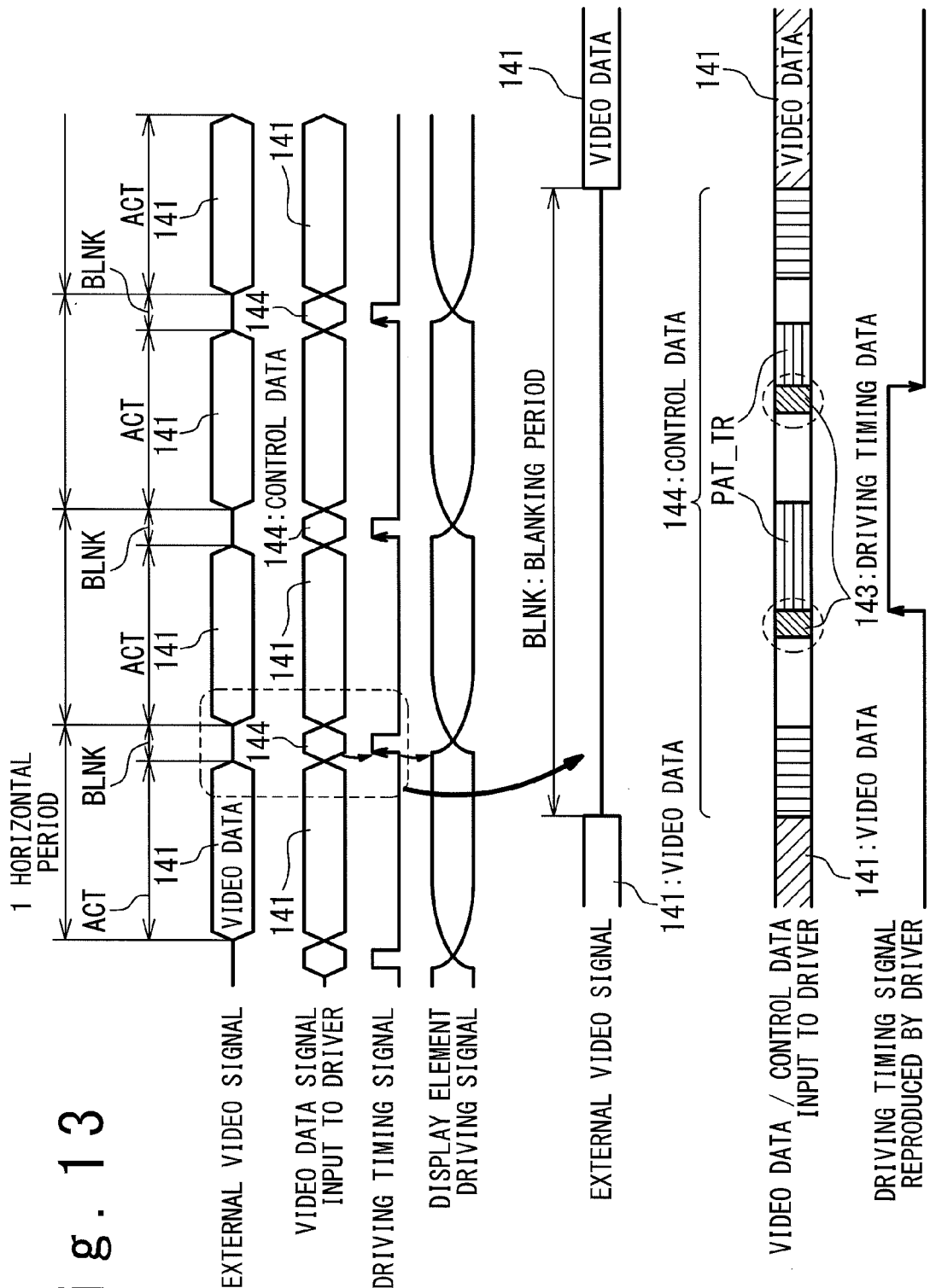

CLOCK DATA RECOVERY CIRCUIT AND DISPLAY DEVICE

INCORPORATION BY REFERENCE

This application is based upon and claims the benefit of priority from Japanese patent application No. 2009-175228, filed on Jul. 28, 2009, the disclosure of which is incorporated herein in its entirety by reference.

BACKGROUND OF THE INVENTION

1. Field of the Invention

The present invention relates to clock data recovery (CDR).

2. Description of Related Art

The clock data recovery is a useful technique in digital data transmission that does not use a clock leased line. More specifically, a clock signal is superimposed on transferred data itself, and a receiving apparatus that has received the data reproduces the clock signal from the received data. Moreover, the receiving apparatus samples the data by using the reproduced clock signal. Such the clock data recovery is used in a high-speed communication interface, a display driver, an optical disk reproducing device and the like.

In the clock data recovery, a PLL (Phase Locked Loop) circuit is typically used. The PLL circuit includes a VCO (Voltage Controlled Oscillator) and can reproduce the clock signal by controlling a control voltage of the VCO such that a desired oscillation frequency is obtained. Such a state where a frequency and a phase of the reproduced clock signal are synchronized with respect to an input signal is called "lock" of the PLL circuit. However, in some cases, the PLL circuit does not operate normally due to various causes and thus the frequency of the reproduced clock is locked at a frequency different from the desired frequency. This state is called "false lock" of the PLL circuit. Since correct data reception is not ensured if the false lock occurs, it is important to detect the occurrence of the false lock at an early stage.

Japanese Patent Publication JP-2005-318014A discloses a method of detecting false lock. More specifically, a method of detecting false lock where a ratio between a data rate and a clock frequency is 1:n (where n is an integer equal to or larger than 2) is as follows. That is, data sampled based on the reproduced clock are monitored for a predetermined period, and occurrence probability of a pattern [0, 1, 0, . . . ] or a pattern [1, 0, 1, . . . ] of three or more bits during the predetermined period is calculated. If the occurrence probability is 0%, it is determined that the false lock of 1:n has occurred.

SUMMARY

The inventor of the present application has recognized the following points. In the case of the above-mentioned Japanese Patent Publication JP-2005-318014A, the occurrence probability of the pattern [0, 1, 0, . . . ] or pattern [1, 0, 1, . . . ] needs to be calculated. If the occurrence probability calculation accuracy is low, the false lock may be detected erroneously. To increase the occurrence probability calculation accuracy requires input of a great deal of data, which leads to an increase in time required for detecting the occurrence of the false lock.

In one embodiment of the present invention, a clock data recovery circuit is provided. The clock data recovery circuit has: a receiver circuit configured to receive a serial data including a predetermined pattern and to sample the serial data in synchronization with a clock signal to generate a sampled data; a PLL circuit configured to perform clock data recovery based on the sampled data to generate the clock signal; and a false lock detection circuit configured to detect false lock of the PLL circuit by detecting a false lock pattern included in the sampled data. The false lock pattern is a pattern obtained by the receiver circuit sampling the predetermined pattern when the false lock of the PLL circuit occurs.

In another embodiment of the present invention, a display device is provided. The display device has: a display driver configured to drive a display panel; and a control device configured to generate a video data signal being a serial data including a predetermined pattern and to transmit the video data signal to the display driver. The display driver has: a receiver configured to receive the video data signal and to sample the video data signal in synchronization with a clock signal to generate a sampled data; a PLL circuit configured to perform clock data recovery based on the sampled data to generate the clock signal; and a false lock detection circuit configured to detect false lock of the PLL circuit by detecting a false lock pattern included in the sampled data. The false lock pattern is a pattern obtained by the receiver sampling the predetermined pattern when the false lock of the PLL circuit occurs.

According to the present invention, the false lock pattern itself is detected from the sampled data in order to detect occurrence of the false lock. There is no need to calculate the occurrence probability of the pattern [0, 1, 0, . . . ] or pattern [1, 0, 1, . . . ] of three or more bits during a predetermined period. Therefore, time required for detecting the occurrence of the false lock is shortened.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6 shows an example of a false lock pattern;

FIG. 13 is a timing chart showing an operation of the display device.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. Data Transmission System

Figure 1:
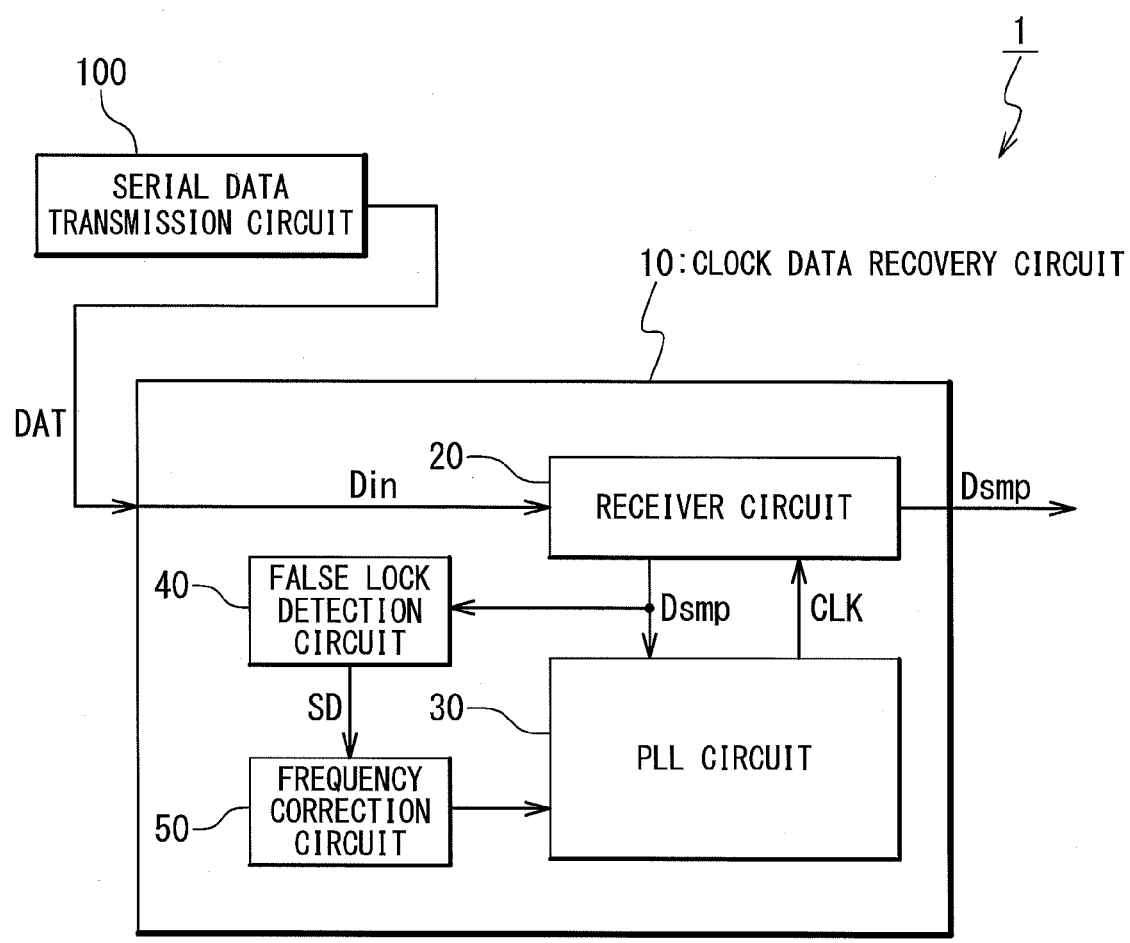
FIG. 1 is a block diagram schematically showing a configuration of a data transmission system according to an embodiment of the present invention.

FIG. 1 schematically shows a configuration of a data transmission system 1 according to an embodiment of the present invention. The data transmission system 1 includes a serial data transmission circuit 100 and a clock data recovery circuit 10. The serial data transmission circuit 100 generates a serial data DAT and transmits the serial data DAT to the clock data recovery circuit 10.

The clock data recovery circuit 10 receives the serial data DAT. The clock data recovery circuit 10 reproduces a clock signal CLK from the received serial data DAT and samples the serial data DAT by using the clock signal CLK (reproduced clock). More specifically, the clock data recovery circuit 10 includes: a receiver circuit 20, a PLL circuit 30, a false lock detection circuit 40 and a frequency correction circuit 50.

The receiver circuit 20 receives as an input data Din the serial data DAT externally supplied. The receiver circuit 20 samples the input data Din in synchronization with the clock signal CLK. As a result of the sampling, a sampled data Dsmp can be obtained. That is, the receiver circuit 20 samples the input data Din based on the clock signal CLK to generate the sampled data Dsmp. The receiver circuit 20 supplies the sampled data Dsmp to the PLL circuit 30 and the false lock detection circuit 40, and also externally outputs it.

The PLL circuit 30 receives the sampled data Dsmp. The PLL circuit 30 performs "clock data recovery" based on the sampled data Dsmp to reproduce the clock signal CLK. The PLL circuit 30 supplies the obtained clock signal CLK (reproduced clock) to the receiver circuit 20.

The false lock detection circuit 40 receives the sampled data Dsmp. The false lock detection circuit 40 detects "false lock" of the PLL circuit 30 by referring to the sampled data Dsmp. Details of the false lock detection processing will be described later. The false lock detection circuit 40, upon detection of occurrence of the false lock, outputs a false lock detection signal SD to the frequency correction circuit 50.

If the false lock is detected by the false lock detection circuit 40, the frequency correction circuit 50 controls the PLL circuit 30 to forcibly reduce its oscillation frequency. That is, the frequency correction circuit 50, in response to the false lock detection signal SD output from the false lock detection circuit 40, controls the PLL circuit 30 in such a manner that the frequency of the clock signal CLK is reduced.

Figure 2:
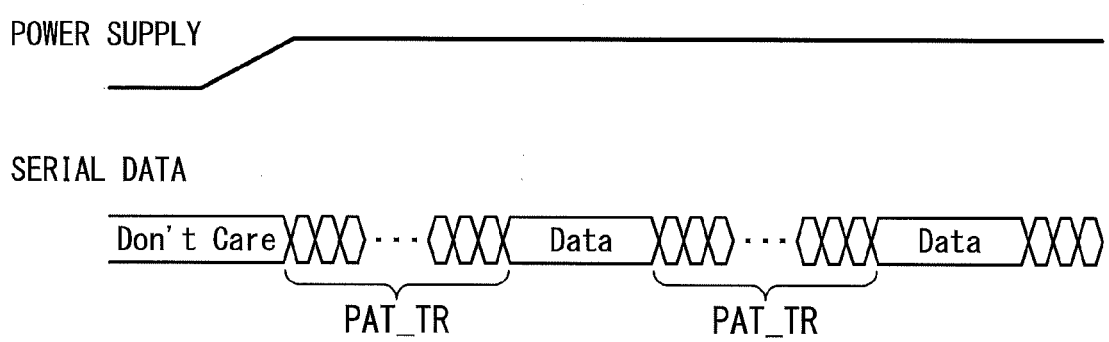
FIG. 2 shows an example of serial data including a training pattern.

In the present embodiment, a "predetermined pattern" included in the serial data DAT is used for detecting the false lock. For example, a "training pattern PAT_TR" for the PLL circuit 30 is used is used as the predetermined pattern. The training pattern PAT_TR is a well-known pattern used for pull-in of the PLL circuit 30 or for maintenance of the locked state of the PLL circuit 30, and is inserted in the serial data DAT at a predetermined timing. For example, as shown in FIG. 2, the training pattern PAT_TR is inserted immediately after power-on and in a place where no problem with system operation arises. Typically, the training pattern PAT_TR consists of repetition of "0" and "1" for a predetermined number of bits (0, 1, 0, 1, 0, 1 . . . ).

The serial data transmission circuit 100 generates the serial data DAT including such a training pattern PAT_TR (predetermined pattern), and then transmits the serial data DAT to the clock data recovery circuit 10. The clock data recovery circuit 10 receives as the input data Din the serial data DAT including the training pattern PAT_TR (predetermined pattern), and performs the clock data recovery and the false lock detection based on the input data Din. A method of detecting the false lock by the use of the training pattern PAT_TR "0, 1, 0, 1, . . . " will be described below.

Figure 3:
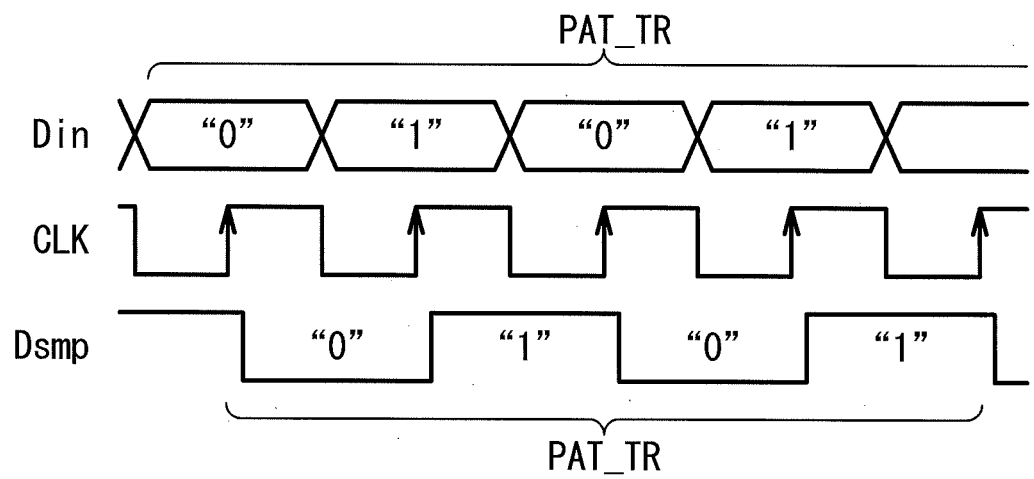
FIG. 3 shows sampling of the training pattern in a case where false lock does not occur.
Figure 4:
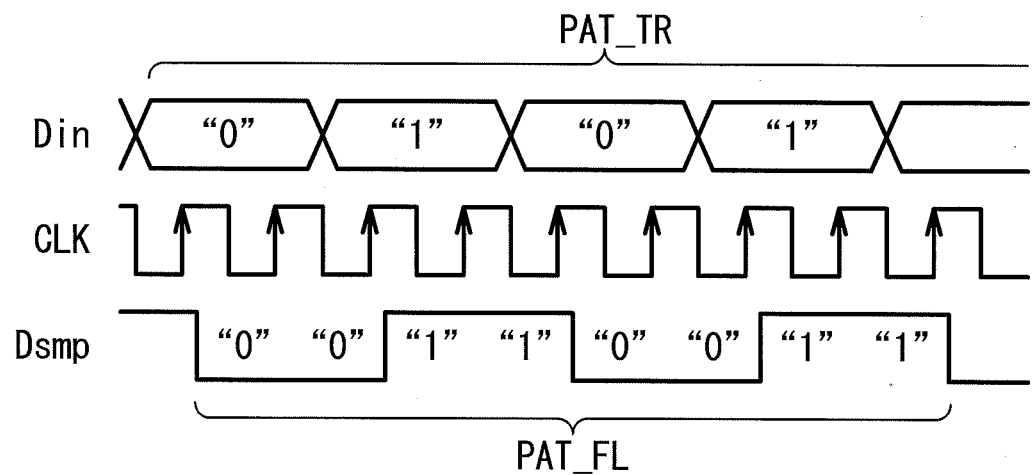
FIG. 4 shows sampling of the training pattern in a case where false lock occurs.

FIGS. 3 and 4 show sampling of the training pattern PAT_TR by the receiver circuit 20. More specifically, the training pattern PAT_TR included in the input data Din input to the receiver circuit 20, the clock signal CLK, and the sampled data Dsmp as a result of the sampling based on the clock signal CLK are shown.

FIG. 3 shows a case where no false lock occurs. In this case, the clock signal CLK having a desired frequency is obtained, and the input data rate and the clock frequency are consistent with each other. The sampled data Dsmp that is obtained as a result of the sampling of the training pattern PAT_TR is "0, 1, 0, 1, . . . ", which is the same pattern as the training pattern PAT_TR.

On the other hand, FIG. 4 shows a case where false lock at a double frequency occurs. In this case, the PLL circuit 30 is locked at a frequency twice the desired frequency, and the clock frequency is twice the desired frequency. Therefore, the sampled data Dsmp that is obtained as a result of the sampling of the training pattern PAT_TR becomes "0, 0, 1, 1, 0, 0, 1, 1, . . . " in which each bit is sampled twice. This pattern different from the training pattern PAT_TR is caused by the occurrence of the false lock and is hereinafter referred to as a "false lock pattern PAT_FL". That is, the false lock pattern PAT_FL is a pattern obtained by the receiver circuit 20 sampling the training pattern PAT_TR (predetermined pattern) in the case where the false lock of the PLL circuit 30 occurs.

The false lock detection circuit 40 according to the present embodiment can detect the false lock of the PLL circuit 30 by detecting the false lock pattern PAT_FL included in the sampled data Dsmp. That is, the false lock detection circuit 40 determines whether or not the false lock pattern PAT_FL is included in the sampled data Dsmp. If the false lock pattern PAT_FL is included in the sampled data Dsmp, the false lock detection circuit 40 outputs the false lock detection signal SD to the frequency correction circuit 50.

In this manner, according to the present embodiment, the false lock pattern PAT_FL itself is detected from the sampled data Dsmp in order to detect the occurrence of the false lock. There is no need to calculate the occurrence probability of the pattern [0, 1, 0, . . . ] or pattern [1, 0, 1, . . . ] of three or more bits during a predetermined period. Therefore, time required for detecting the occurrence of the false lock is shortened.

If the false lock is detected by the false lock detection circuit 40, the frequency correction circuit 50 may control the PLL circuit 30 to forcibly reduce the frequency of the clock signal CLK. Consequently, the PLL circuit 30 becomes a normal operation state.

It should be noted that the serial data transmission circuit 100 inserts the training pattern PAT_TR into the serial data DAT that does not contain the false lock pattern PAT_FL. That is, the serial data DAT (input data Din) received by the clock data recovery circuit 10 does not include the false lock pattern PAT_FL. Therefore, erroneous detection of the false lock can be prevented.

For example, the clock data recovery circuit 10 is applied to an asynchronous communication interface that processes communication data and to a display driver that processes a display data. Such communication data and display data are subjected to various processing on a transmission side and thus do not contain the false lock pattern PAT_FL as described above.

The predetermined pattern used for the false lock detection is not limited to the above-mentioned "0, 1, 0, 1, ...". Any pattern can be used as the predetermined pattern as long as the corresponding false lock pattern PAT_FL is not included in the serial data DAT and can also easily be detected by the false lock detection circuit 40.

2. Various Examples of Clock Data Recovery Circuit 10

There are various possible types of configuration for the clock data recovery circuit 10. Some examples thereof will be described below.

2-1. First Example

Figure 5:
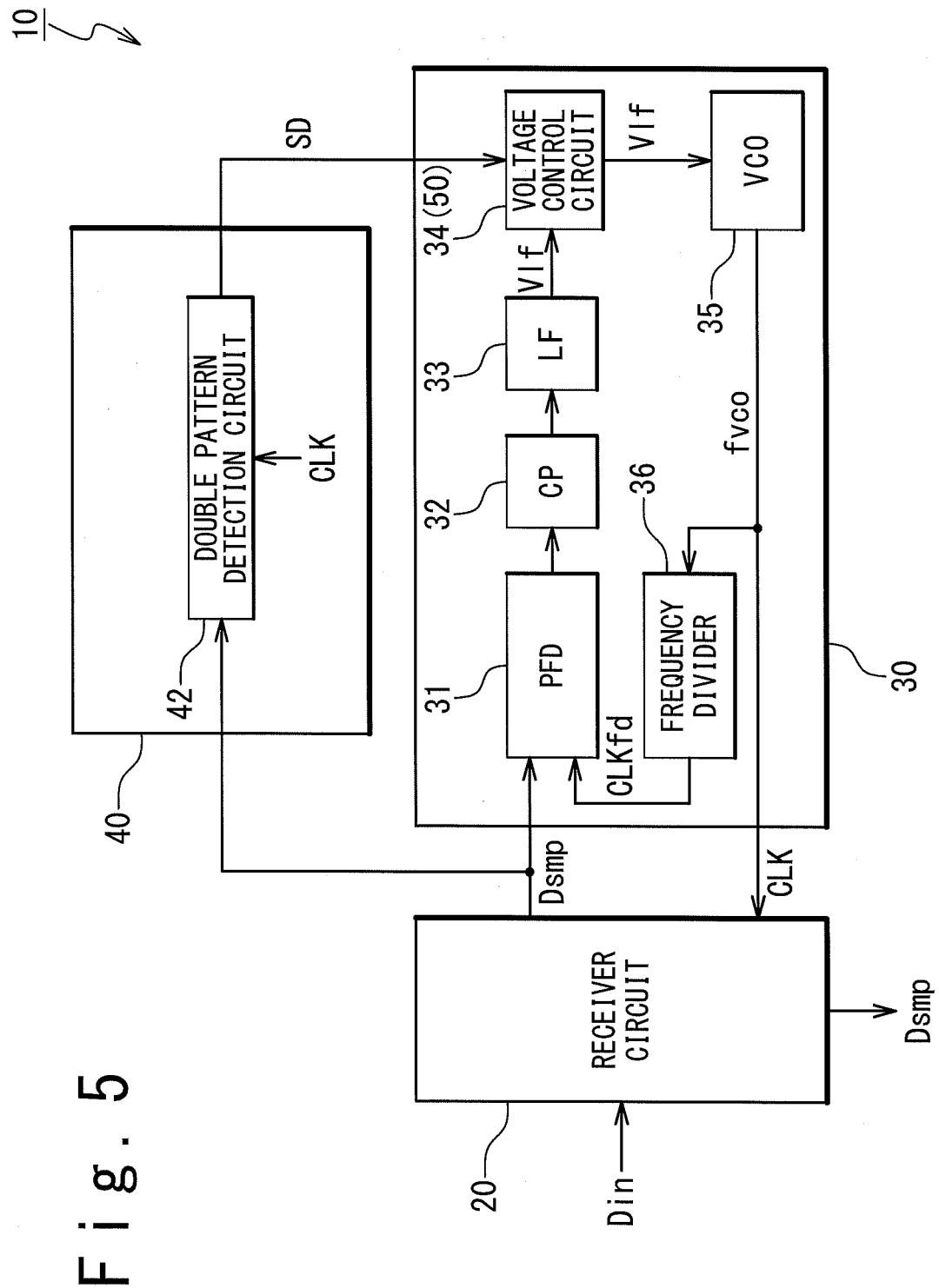
FIG. 5 is a block diagram showing a configuration example of a clock data recovery circuit.

FIG. 5 is a block diagram showing an example of the configuration of the clock data recovery circuit 10. In the present example, the false lock detection circuit 40 includes a double pattern detection circuit 42.

The double pattern detection circuit 42 detects the false lock pattern PAT_FL as shown in FIG. 4 to detect the false lock at the double frequency. Note that the first bit of data may not be determined in some cases such as a case immediately after the power-on. Therefore, it is preferable that the double pattern detection circuit 42 can detect the false lock pattern PAT_FL whatever the sampling start bit might be. FIG. 6 shows four types of the false lock pattern PAT_FL to be detected by the double pattern detection circuit 42 in the case where the training pattern PAT_TR is "0, 1, 0, 1, ...".

Figure 7:
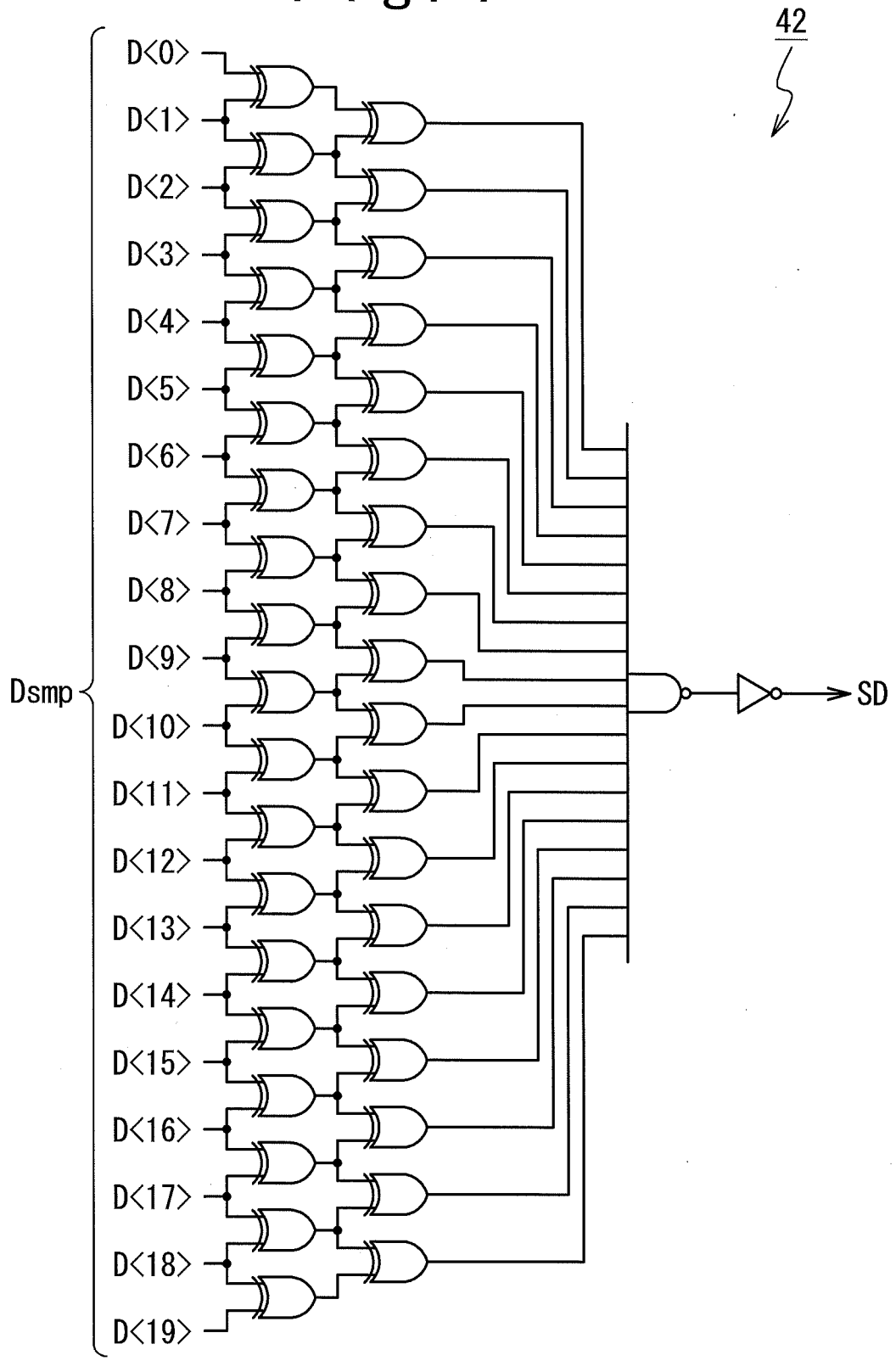
FIG. 7 is a circuit diagram showing a configuration example of a double pattern detection circuit.

FIG. 7 shows a circuit configuration example capable of detecting the four types of the false lock pattern PAT_FL shown in FIG. 6 The double pattern detection circuit 42 shown in FIG. 7 is provided with two stages of EXOR circuits and an 18-input AND circuit. An output of the AND circuit corresponds to the false lock detection signal SD. A 20-bit data (D<0> to D<19>) is supplied to the double pattern detection circuit 42. If the 20-bit data matches any type of the false lock pattern PAT_FL shown in FIG. 6, the false lock detection signal SD is activated and turns to the High level ("1"). Therefore, the false lock can be detected by sequentially supplying the sampled data Dsmp by 20-bits at a time. To supply the sampled data Dsmp can be achieved, for example, by using a serial-parallel conversion circuit or a shift register that operates based on the clock signal CLK.

Referring again to FIG. 5, the PLL circuit 30 includes: a phase-frequency detector (PFD) 31, a charge pump 32, a loop filter 33, a voltage control circuit 34, a voltage controlled oscillator (VCO) 35 and a frequency divider 36.

The charge pump 32 supplies a current to the loop filter 33. An output voltage of the loop filter 33 is a filter voltage Vlf. This filter voltage Vlf is supplied to the VCO 35. An oscillation frequency fvco of the VCO 35 varies depending on the filter voltage Vlf. That is, the VCO 35 generates the clock signal CLK whose clock frequency fvco depends on the filter voltage Vlf. The frequency divider 36 frequency-divides the clock signal CLK output from the VCO 35 to generates a feedback clock CLKfd.

The phase-frequency detector 31 receives the sampled data Dsmp and the feedback clock CLKfd. First, the phase-frequency detector 31 detects a difference in the frequency between the sampled data Dsmp and the feedback clock CLKfd, and controls an operation of the charge pump 32 in such a manner as to eliminate the difference. After the frequencies of the sampled data Dsmp and the feedback clock CLKfd almost match with each other, phase adjustment is performed. Specifically, the phase-frequency detector 31 detects a difference in the phase between the sampled data Dsmp and the feedback clock CLKfd, and controls the operation of the charge pump 32 in such a manner as to eliminate the difference. In this manner, the filter voltage Vlf and the clock frequency fvco are controlled to be respective desired values, and thereby sampling as shown in FIG. 3 is achieved. Note that the frequency divider 36 is a ½ frequency divider in the case of the example shown in FIG. 3.

If the false lock occurs (see FIG. 4), the clock frequency fvco is higher than the desired value. In this case, the filter voltage Vlf supplied to the VCO 35 is higher than the desired value, and thus the filter voltage Vlf just needs to be reduced. To this end, as shown in FIG. 5, the voltage control circuit 34 is provided at a stage before the VCO 35. The voltage control circuit 34, in response to the false lock detection signal SD, reduces the filter voltage Vlf supplied to the VCO 35. As a result, the clock frequency fvco also is reduced. That is, the voltage control circuit 34 corresponds to the frequency correction circuit 50 shown in FIG. 1 and lowers the clock frequency fvco by reducing the filter voltage Vlf when the false lock is detected.

Figure 8:
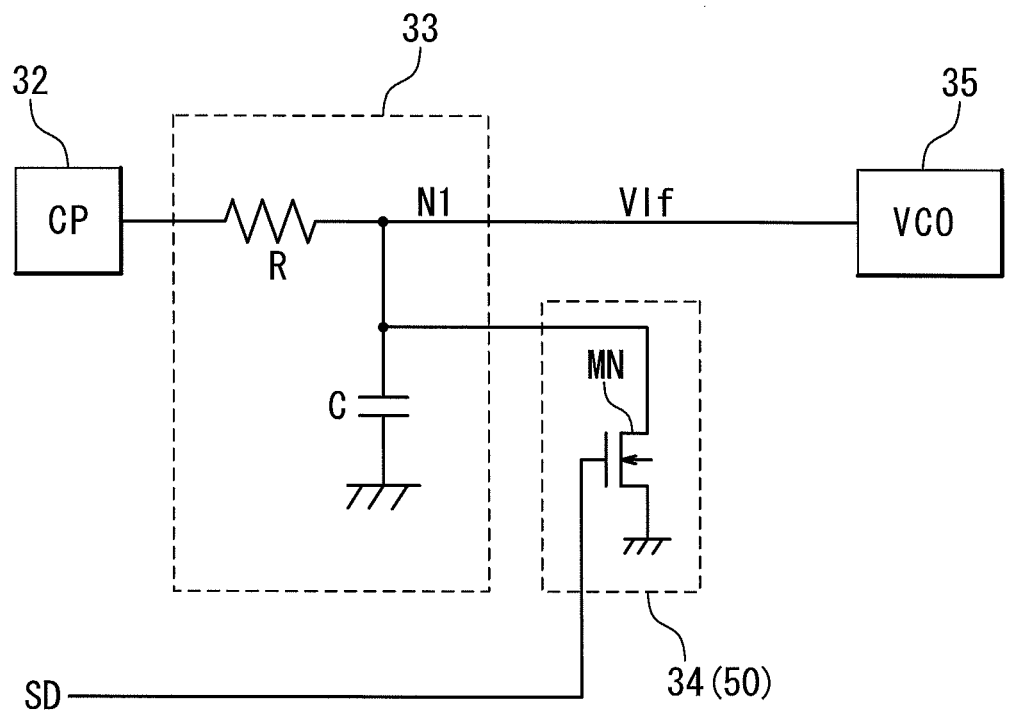
FIG. 8 is a circuit diagram showing a configuration example of a loop filter and a voltage control circuit.

FIG. 8 shows an example of the loop filter 33 and the voltage control circuit 34 (frequency correction circuit 50). The loop filter 33 is exemplified by an RC filter. An output node N1 of the loop filter 33 is connected to the voltage control circuit 34 and the VCO 35. The voltage control circuit 34 includes an NMOS transistor MN connected between the output node N1 and a ground line. The false lock detection signal SD is supplied to a gate electrode of the NMOS transistor MN. When the occurrence of the false lock is detected, the false lock detection signal SD is activated to be the High level, and thereby the NMOS transistor MN is turned on. As a result, the voltage of the output node N1 of the loop filter 33 is decreased, and hence the filter voltage Vlf input to the VCO 35 is decreased. Consequently, the clock frequency fvco is reduced and thus the false lock is resolved.

Figure 9:
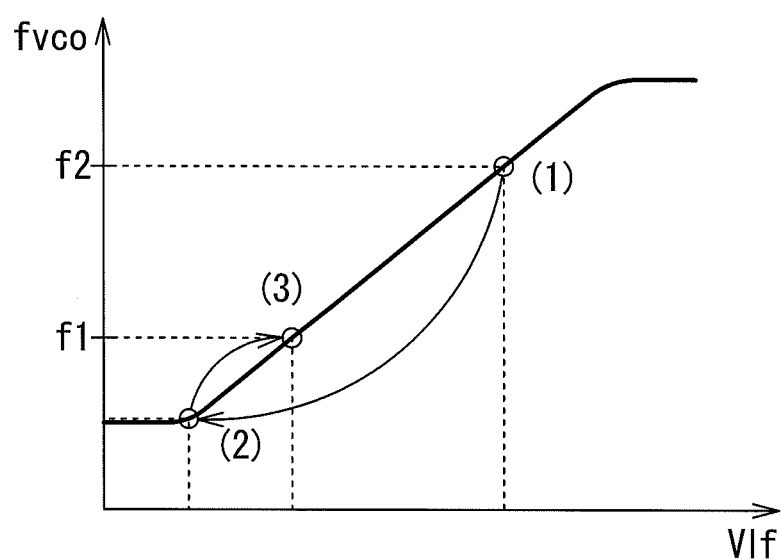
FIG. 9 shows an operation example of the clock data recovery circuit.

FIG. 9 shows an example of the operation. In FIG. 9, a horizontal axis represents the filter voltage Vlf input to the VCO 35, and a vertical axis represents the clock frequency fvco. The clock frequency fvco varies depending on the filter voltage Vlf. A frequency f1 is the desired clock frequency, and a frequency f2 is twice the frequency f1. In a state (1), the false lock at the double frequency f2 occurs. When the false lock detection circuit 40 detects the false lock, the voltage control circuit 34 (frequency correction circuit 50) reduces the filter voltage Vlf to lower the clock frequency fvco (state (2)). Thereafter, the PLL circuit 30 operates normally and is locked at the desired clock frequency f1 (state (3)).

2-2. Second Example

The false lock detected by the false lock detection circuit 40 is not limited to the one at the double frequency. The false lock detection circuit 40 may detect false lock at n-multiple frequency (where n is an integer equal to or larger than 2). Moreover, the false lock detection circuit 40 may be so configured as to detect plural patterns of false lock.

Figure 10:
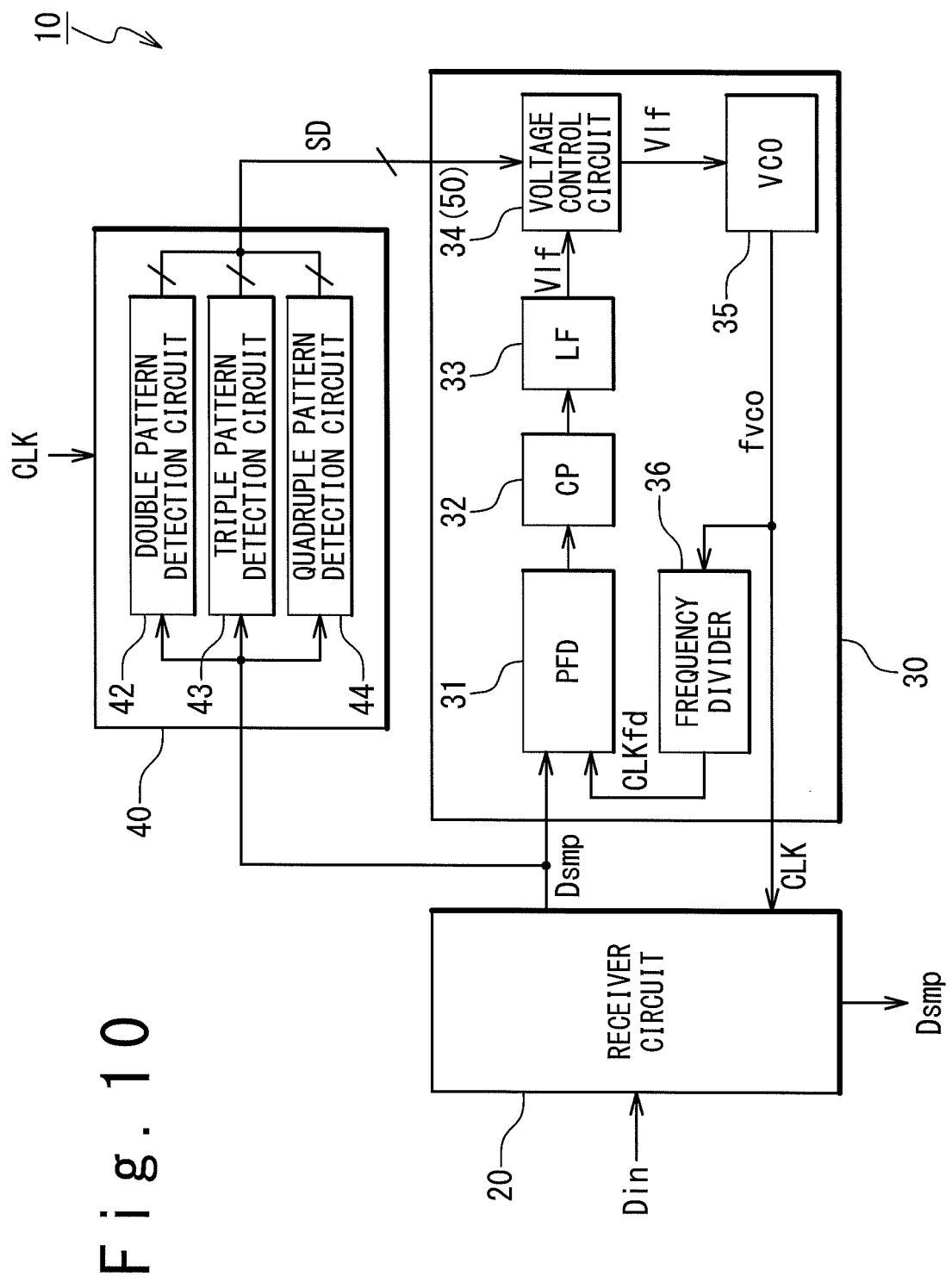
FIG. 10 is a block diagram showing another configuration example of the clock data recovery circuit.

In an example shown in FIG. 10, the false lock detection circuit 40 detects false lock at the double frequency, the triple frequency and the quadruple frequency. More specifically, the false lock detection circuit 40 includes the double pattern detection circuit 42, a triple pattern detection circuit 43 and a quadruple pattern detection circuit 44. The double pattern detection circuit 42, as in the case of the first example, detects the false lock at the double frequency and outputs the false lock detection signal SD to the voltage control circuit 34. Similarly, the triple pattern detection circuit 43 and the quadruple pattern detection circuit 44 respectively detect the false lock at the triple frequency and the quadruple frequency, and output the false lock detection signal SD to the voltage control circuit 34.

For example, the false lock detection signal SD is a one-bit signal, as in the case of the first example. In this case, when the false lock is detected by any of the detection circuits (42, 43 and 44), the false lock detection signal SD is turned to the High level ("1"). The configuration of the voltage control circuit 34 in this case is the same as that in the first example (see FIG. 8).

Figure 11:
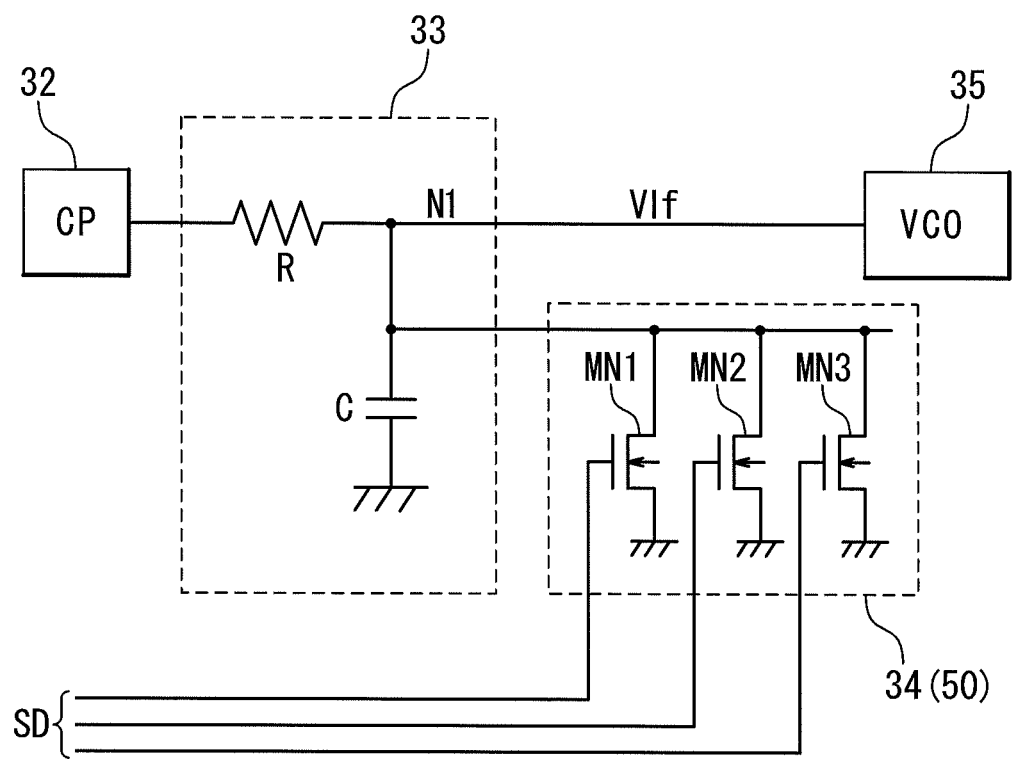
FIG. 11 is a circuit diagram showing another configuration example of the loop filter and the voltage control circuit.

Alternatively, the false lock detection signal SD may be a multi-bit signal. In this case, content of the false lock detection signal SD varies depending on the pattern of the detected false lock. FIG. 11 shows a configuration example of the voltage control circuit 34 (frequency correction circuit 50) that supports the multi-bit false lock detection signal SD. The voltage control circuit 34 includes a plurality of NMOS transistors MN1, MN2 and MN3 which are connected in parallel between the output node N1 of the loop filter 33 and the ground line. Respective bits of the false lock detection signal SD are supplied to gate electrodes of the NMOS transistors MN1, MN2 and MN3.

For example, in a case where the false lock at the double frequency is detected, only one NMOS transistor MN1 is turned on. In a case where the false lock at the triple frequency is detected, two NMOS transistors MN1 and MN2 are turned on. In a case where the false lock at the quadruple frequency is detected, three NMOS transistors MN1 to MN3 are turned on. As a result, the control amount of the filter voltage Vlf varies depending on the type of the detected false lock. More specifically, in the case where the false lock at the triple frequency is detected, the voltage control circuit 34 reduces the filter voltage Vlf greater than in the case where the false lock at the double frequency is detected. In the case where the false lock at the quadruple frequency is detected, the voltage control circuit 34 reduces the filter voltage Vlf further greater than in the case where the false lock at the triple frequency is detected. This makes it possible to quickly resolve the false lock whatever pattern it might be.

2-3. Other Examples

The oscillation frequency fvco of the VCO 35 may be limited. For example, the oscillation frequency fvco of the VCO 35 is so limited as to be less than three times the desired frequency fl. In this case, the number of false lock types to be detected is decreased, and thus an area of the false lock detection circuit 40 is reduced as in the case of the first example.

The false lock detection circuit 40 may be ON/OFF controlled by a predetermined control signal. For example, when input timing of the training pattern PAT_TR is known, the false lock detection circuit 40 may be activated in accordance with the input timing. Since the false lock detection circuit 40 is deactivated during the other period, power consumption can be reduced.

3. Display Device

The clock data recovery circuit 10 according to the present embodiment is applicable to a display driver for driving a display panel of a display device. In this case, the serial data DAT supplied to the clock data recovery circuit 10 is a video data signal supplied to the display driver. In general, the video data signal includes: a "video data" corresponding to video displayed on the display panel; and a "control data" for controlling processing of the video data in the display driver. Therefore, it is possible to easily insert the above-mentioned training pattern PAT_TR into the video data signal without affecting the video data. That is, the training pattern PAT_TR just needs to be included in the control data.

Figure 12:
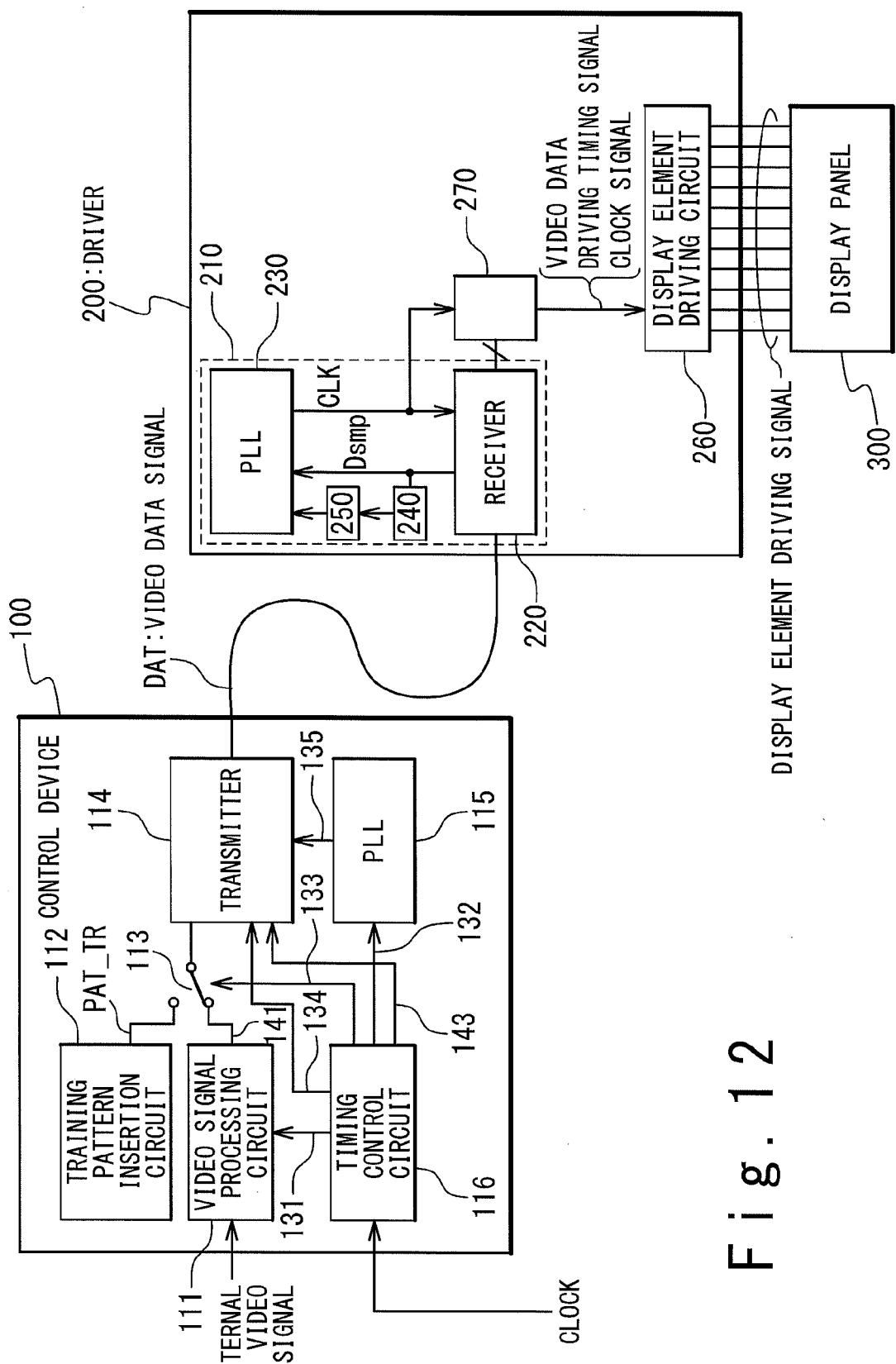
FIG. 12 is a block diagram schematically showing a configuration of a display device according to an embodiment of the present invention.

FIG. 12 schematically shows a configuration example of the display device according to the present embodiment. The display device is provided with: a control device 100, a driver 200 and a display panel 300 in which display elements are arranged in a matrix form. FIG. 13 is a timing chart showing an operation of the display device shown in FIG. 12. Referring to FIGS. 12 and 13, the display device according to the present embodiment will be described.

The control device 100 corresponds to the serial data transmission circuit 100 shown in FIG. 1. That is, the control device 100 generates the video data signal DAT (serial data) including the training pattern PAT_TR, and transmits the video data signal DAT to the driver 200. More specifically, the control device 100 is provided with: a video signal processing circuit 111, a training pattern insertion circuit 112, a switch 113, a transmitter 114, a PLL circuit 115 and a timing control circuit 116.

The video signal processing circuit 111 receives an external video signal and generates a video data 141 from the external video signal. As shown in FIG. 13, each horizontal period includes an active period ACT corresponding to the video data 141 and a blanking period BLNK other than the active period ACT. As will be described later, a control data 144 is inserted into the blanking period BLNK.

The training pattern insertion circuit 112 generates the above-mentioned training pattern PAT_TR to be inserted into the video data signal DAT. The training pattern PAT_TR is a pattern used for pull-in of the PLL circuit or maintenance of the locked state of the PLL circuit, and typically is "0, 1, 0, 1, . . . ".

The timing control circuit 116 performs timing control of the control device 100 and the driver 200, based on an external clock signal. More specifically, the timing control circuit 116 supplies timing control signals 131 and 132 respectively to the video signal processing circuit 111 and the PLL circuit 115 to control operation timings of these circuits. Moreover, the timing control circuit 116 supplies a switch control signal 133 to the switch 113 to control switching timing of the switch 113. Furthermore, the timing control circuit 116 supplies a transmitter control signal 134 to the transmitter 114 to control the transmitter 114. In addition to that, the timing control circuit 116 supplies to the transmitter 114 a driving timing data 143 that specifies driving timing of the driver 200.

Depending on the switch control signal 133 from the timing control circuit 116, the switch 113 selectively transmits the video data 141 transmitted from the video signal processing circuit 111 or the training pattern PAT_TR transmitted from the training pattern insertion circuit 112, to the transmitter 114.

The transmitter 114 generates the video data signal DAT as shown in FIG. 13, and transmits the video data signal DAT to the driver 200. More specifically, the video data signal DAT includes the video data 141 and the control data 144. The video data 141 corresponds to the video displayed on the display panel 300 and is transmitted during the active period ACT. On the other hand, the control data 144 is inserted in the blanking period BLNK between the active periods ACT. The control data 144 is data for controlling processing of the video data 141 in the driver 200, and includes at least the driving timing data 143. Furthermore, the control data 144 also includes the training pattern PAT_TR. The control data 144 may include arbitrary data in addition to the driving timing data 143 and the training pattern PAT_TR.

It should be noted that the transmitter 114 transmits the video data signal DAT to the driver 200 in synchronization with a clock signal 135 supplied from the PLL circuit 115. That is, the clock signal is superimposed on the video data signal DAT.

The driver 200 receives the video data signal DAT from the control device 100, and drives the display elements of the display panel 300 in response to the video data signal DAT. More specifically, the driver 200 is provided with: a clock data recovery circuit 210, a display element driving circuit 260 and a signal processing circuit 270.

The clock data recovery circuit 210 is provided with: a receiver circuit 220, a PLL circuit 230, a false lock detection circuit 240 and a frequency correction circuit 250. The clock data recovery circuit 210, the receiver circuit 220, the PLL circuit 230, the false lock detection circuit 240 and the frequency correction circuit 250 are respectively equivalent to the clock data recovery circuit 10, the receiver circuit 20, the PLL circuit 30, the false lock detection circuit 40 and the frequency correction circuit 50 shown in FIG. 1. The clock data recovery circuit 210 performs the false lock detection by using the training pattern PAT_TR (predetermined pattern) included in the control data 144 in the video data signal DAT. When the false lock is detected, the clock data recovery circuit 210 quickly reduces the clock frequency, and thereby the PLL circuit 230 is locked properly.

Moreover, the receiver circuit 220, based on the received video data signal DAT, reproduces the clock signal CLK and takes the video data signal DAT. After that, the signal processing circuit 270 restores the video data 141 and the driving timing signal and outputs the video data 141, the driving timing signal and the clock signal CLK to the display element driving circuit 260. The driving timing signal is a signal for specifying driving timing of the display element driving circuit 260, and is generated based on the driving timing data 143. Specifically, as shown in FIG. 13, the driving timing signal is activated in response to the first driving timing data 143 in the blanking period BLNK, and the driving timing signal is deactivated in response to the second driving timing data 143.

The display element driving circuit 260, upon detection of the activation of the driving timing signal, starts driving of the display elements in a selected line of the display panel 300. More specifically, the display element driving circuit 260 generates a display element driving signal in accordance with the video data 141 transferred during the last active period ACT, and supplies the display element driving signal to a data line of the display panel 300. As a result, the display elements in the selected line of the display panel 300 are driven.

As the display panel 300, for example, an LCD panel, an organic electro-luminescence display panel, or a field-emission display panel can be used. In a case of a liquid crystal display device in which the LCD panel is used as the display panel 300, the control device 100 corresponds to an LCD controller and the driver 200 corresponds to a source driver (or a data line driver).

The embodiment of the present invention has been described above referring to the accompanying drawings. Note, however, that the present invention is not limited to the embodiment described above, but can be modified as appropriate by those skilled in the art within a scope not departing from its spirits.

What is claimed is:

1. A clock data recovery circuit comprising:
a receiver circuit configured to receive a serial data including a predetermined pattern and to sample said serial data in synchronization with a clock signal to generate a sampled data;
a PLL circuit configured to perform clock data recovery based on said sampled data to generate said clock signal; and
a false lock detection circuit configured to detect false lock of said PLL circuit by detecting that a false lock pattern is included in said sampled data,
wherein said false lock pattern is a pattern obtained by said receiver circuit sampling said predetermined pattern when said false lock of said PLL circuit occurs,
wherein said serial data is a video data signal supplied to a display driver for a display device,
wherein said video data signal comprises:
a video data corresponding to a video image displayed on said display device; and
a control data for controlling processing of said video data in said display driver, and
wherein said predetermined pattern is contained in said control data.

2. The clock data recovery circuit according to claim 1, further comprising a frequency correction circuit configured to control, when said false lock is detected by said false lock detection circuit, said PLL circuit such that a frequency of said clock signal is reduced.

3. The clock data recovery circuit according to claim 2, wherein said PLL circuit includes a voltage controlled oscillator configured to generate said clock signal whose frequency depends on an output voltage of a loop filter, and
wherein when said false lock is detected by said false lock detection circuit, said frequency correction circuit reduces said output voltage supplied to said voltage controlled oscillator.

4. The clock data recovery circuit according to claim 3, wherein said false lock detection circuit comprises:
a first false lock detection circuit configured to detect first false lock that is said false lock at a first frequency higher than a desired frequency; and
a second false lock detection circuit configured to detect second false lock that is said false lock at a second frequency further higher than said first frequency,
wherein said frequency correction circuit reduces said output voltage greater when said second false lock is detected than when said first false lock is detected.

5. The clock data recovery circuit according to claim 1, wherein said predetermined pattern is a training pattern inserted in said serial data for pull-in of said PLL circuit or for maintenance of a locked state of said PLL circuit.

6. The clock data recovery circuit according to claim 1, wherein said false lock detection circuit is inactivated during a period of transferring said video data, and activated during a period of transferring said control data.

7. A display device comprising:
a display driver configured to drive a display panel; and
a control device configured to generate a video data signal being a serial data including a predetermined pattern and to transmit said video data signal to said display driver,
wherein said display driver comprises:
a receiver configured to receive said video data signal and to sample said video data signal in synchronization with a clock signal to generate a sampled data;
a PLL circuit configured to perform clock data recovery based on said sampled data to generate said clock signal; and
a false lock detection circuit configured to detect false lock of said PLL circuit by detecting that a false lock pattern is included in said sampled data, wherein said false lock pattern is a pattern obtained by said receiver sampling said predetermined pattern when said false lock of said PLL circuit occurs,
wherein said serial data is a video data signal supplied to a display driver for a display device,
wherein said video data signal comprises:
  a video data corresponding to a video image displayed on said display device; and
  a control data for controlling processing of said video data in said display driver, and
wherein said predetermined pattern is contained in said control data.

8. The display device according to claim 7,
wherein said display driver further comprises a frequency correction circuit, and
wherein when said false lock is detected by said false lock detection circuit, said frequency correction circuit controls said PLL circuit such that a frequency of said clock signal is reduced.

9. The display device according to claim 7,
wherein said predetermined pattern is a training pattern inserted in said video data signal for pull-in of said PLL circuit or for maintenance of a locked state of said PLL circuit.

10. The display device according to claim 7,
wherein said predetermined pattern is transmitted in a first period, and
said false lock detection circuit is activated during a predetermined period including said first period and deactivated during other than said predetermined period.

* * * * *